United States Patent
Kwon

(10) Patent No.: US 9,088,253 B2
(45) Date of Patent: Jul. 21, 2015

(54) RADIO FREQUENCY AMPLIFIER IN COMMUNICATION SYSTEM AND METHOD OF CONTROLLING THE SAME

(75) Inventor: Ku-Duck Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 3 days.

(21) Appl. No.: 13/567,465

(22) Filed: Aug. 6, 2012

(65) Prior Publication Data

US 2013/0038396 A1 Feb. 14, 2013

(30) Foreign Application Priority Data

Aug. 9, 2011 (KR) .................. 10-2011-0079063

(51) Int. Cl.
*H03F 3/45* (2006.01)
*H03F 3/193* (2006.01)
*H03G 1/00* (2006.01)

(52) U.S. Cl.
CPC ............ *H03F 3/45179* (2013.01); *H03F 3/193* (2013.01); *H03G 1/0029* (2013.01); *H03F 2200/294* (2013.01); *H03F 2203/45302* (2013.01); *H03F 2203/45306* (2013.01); *H03F 2203/45318* (2013.01)

(58) Field of Classification Search
CPC ........................................................ H03F 3/45
USPC ........................................... 330/254, 261, 69
See application file for complete search history.

(56) References Cited

U.S. PATENT DOCUMENTS

| | | | |
|---|---|---|---|
| 3,641,450 A * | 2/1972 | Lunn .......................... 330/254 |
| 5,057,787 A * | 10/1991 | Arai et al. ................... 330/254 |
| 5,587,689 A * | 12/1996 | Bowers ....................... 330/254 |
| 6,163,215 A * | 12/2000 | Shibata et al. .............. 330/254 |
| 6,169,452 B1 * | 1/2001 | Popescu et al. ............. 330/254 |
| 6,639,468 B2 | 10/2003 | Belot |
| 7,095,988 B2 | 8/2006 | Ben-Ayun et al. |
| 7,120,411 B2 * | 10/2006 | Darabi ..................... 455/240.1 |
| 7,403,071 B2 | 7/2008 | Hollenbeck et al. |
| 8,217,720 B2 * | 7/2012 | Chan ............................ 330/254 |
| 2004/0119536 A1 | 6/2004 | Kwon et al. |
| 2011/0063030 A1 | 3/2011 | Jang et al. |
| 2011/0095822 A1 | 4/2011 | Chan |

FOREIGN PATENT DOCUMENTS

KR 10-2004-0051365 A 6/2004

* cited by examiner

*Primary Examiner* — Henry Choe
(74) *Attorney, Agent, or Firm* — Jefferson IP Law, LLP

(57) ABSTRACT

A Radio Frequency (RF) amplifier in a communication system and a method for controlling the RF amplifier are provided. The RF amplifier includes an input unit for receiving an RF signal, a cascode unit for amplifying the RF signal according to a gain of the RF amplifier and for outputting the amplified RF signal, a load unit connected to the cascode unit, and a gain controller for controlling the gain by converting an impedance in a baseband to an impedance viewed from an RF band, the gain controller being connected in parallel to the load unit.

18 Claims, 7 Drawing Sheets

RADIO FREQUENCY AMPLIFIER IN COMMUNICATION SYSTEM AND METHOD OF CONTROLLING THE SAME

PRIORITY

This application claims the benefit under 35 U.S.C. §119(a) of a Korean patent application filed on Aug. 9, 2011 in the Korean Intellectual Property Office and assigned Serial No. 10-2011-0079063, the entire disclosure of which is hereby incorporated by reference.

BACKGROUND OF THE INVENTION

1. Field of the Invention

The present invention relates to a Radio Frequency (RF) amplifier in a communication system and a method of controlling the RF amplifier. More particularly, the present invention relates to an RF amplifier for performing a fine gain control and a method of controlling the RF amplifier performing the fine gain control.

2. Description of the Related Art

An amplifier should provide a gain that is suitable for a signal received through an antenna in a wireless communication system, and a Low Noise Amplifier (LNA) is commonly used to provide a suitable gain.

The low noise amplifier may be an amplifier for amplifying an RF signal received through an antenna in the wireless communication system, and the low noise amplifier amplifies the received signal so that a desired Radio Frequency (RF) signal may be obtained while generating little noise in the desired RF signal. In order to obtain the desired RF signal, the low noise amplifier should provide sufficient variable gains. Hereinafter, a method of providing a variable gain in the low noise amplifier in the related art will be described with reference to FIGS. 1 to 3.

FIG. 1 schematically illustrates an internal structure of a low noise amplifier in a communication system according to the related art.

Referring to FIG. 1, the low noise amplifier includes an input unit 110, a cascode unit 120, and a load unit 130.

Differential RF signals, such as a positive (+) signal and a negative (−) are received by the input unit 110 through an antenna (not shown) and are amplified according to an impedance value of the load unit 130, and the amplified differential RF signals (+, −) are output through the cascode unit 120. That is, input terminals 101 and 103 respectively receive one of the differential input signals of the low noise amplifier, and output terminal 141 and 143 output the amplified differential input signals. Hereinafter, it should be understood that "+" and "−" in an input side correspond to the input terminals and "+" and "−" in an output side correspond to the output terminals.

As described above, in order to obtain a desired RF signal from the received RF signal, the low noise amplifier should include sufficient variable gains, and a gain control for providing the sufficient variable gains may be achieved through modifications in a circuit of the cascode unit 120 or the load unit 130, as described in more detail with reference to FIGS. 2 and 3.

FIG. 2 is a circuit diagram for describing a gain control method using a cascode unit according to the related art.

Referring to FIG. 2, an example of the cascode unit 120 of the low noise amplifier of FIG. 1 is shown in more detail. The low noise amplifier for performing the gain control through the cascode unit 120 includes a transistor terminal 121 for performing an amplification operation according to a bias voltage (VBias) connected and applied to the input unit 110 and the load unit 130, a first gain controller 122a connected to an end of the transistor terminal 121, and a second gain controller 122b connected to another end of the transistor terminal 121.

Each of the first and second gain controllers 122a and 122b includes N transistors, $TR_{GC0}$ to $TR_{GC(N-1)}$, involved in the gain control. In the circuit diagram shown in FIG. 2, the RF signal is transferred to one or more transistors selected according to a control of an external circuit (not shown), and accordingly the gain is controlled, and thus a size of the RF output signal may be determined.

FIG. 3 is a circuit diagram for describing a gain control method through a load unit according to the related art.

Referring to FIG. 3, the load unit 130 of the low noise amplifier of FIG. 1 is shown in more detail. The low noise amplifier for performing the gain control through the load unit 130 includes a third gain controller 132a connected to an end of the cascode unit 120 to control the gain of the RF signal and also includes a fourth gain controller 132b connected to another end of the cascode unit 120 to control the gain of the RF signal. Each of the third and fourth gain controllers 132a and 132b includes N transistors, $TR_{GC0}$ to $TR_{GC(N-1)}$, involved in the gain control and resistors, $R_0$ to $R_{(N-1)}$, each of the resistors being respectively connected to an end of each of the transistors $TR_{GC0}$ to $TR_{GC(N-1)}$.

In the circuit diagram shown in FIG. 3, the RF signal is transferred to at least one transistor selected according to a control of an external circuit (not shown), and the gain is controlled according to a resistance value of the respective resistance connected to an end of the at least one selected transistor, and thus a size of the RF output signal may be determined. The gain control methods in the related art, as described with reference to FIGS. 2 and 3, use N−1 additional transistors for the gain control of N steps. Accordingly, parasitic components corresponding to a number of increased transistors may be generated, and the generated parasitic components may result in deterioration of frequency characteristics, noise characteristics, linearity and other characteristics of an RF amplifier.

Accordingly, a need exists for a system and a method of controlling a gain while not generating a deterioration of capabilities of an RF amplifier.

SUMMARY OF THE INVENTION

Aspects of the present invention are to address at least the above-mentioned problems and/or disadvantages and to provide at least the advantages described below. Accordingly, an aspect of the present invention is to provide a Radio Frequency (RF) amplifier in a communication system and a method of controlling the same.

Furthermore, an aspect of the present invention is to provide an RF amplifier capable of controlling a gain without deterioration of capabilities of the RF amplifier due to parasitic components within the RF amplifier in the communication system and a method of controlling the same.

Furthermore, an aspect to the present invention is to provide an RF amplifier capable of performing a fine gain control without the deterioration of the capabilities of the RF amplifier in the communication system and a method of controlling the same.

Other technical problems to be addressed may be grasped by the following exemplary embodiments and descriptions.

In accordance with an aspect of the present invention, an RF amplifier in a communication system including an input unit for receiving an RF signal is provided. The amplifier includes a cascode unit for amplifying the RF signal according to a gain of the RF amplifier and for outputting the amplified RF signal, a load unit connected to the cascode unit, and a gain controller for controlling the gain by converting an impedance in a baseband to an impedance viewed from an RF band, the gain controller being connected in parallel to the load unit.

In accordance with another aspect of the present invention, a method of controlling an RF amplifier in a communication system is provided. The method includes receiving an RF signal and amplifying the RF signal according to a gain, wherein the gain is controlled by converting an impedance in a baseband to an impedance viewed from an RF band.

According to an aspect of the present invention, a deterioration of the capabilities of the RF amplifier due to a parasitic capacitance component may be reduced and/or prevented and a fine gain control by performing an impedance conversion from a baseband to an RF band may be achieved.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention describe a Radio Frequency (RF) amplifier in a communication system and a method of controlling the same. The RF amplifier described according to the exemplary embodiments of the present invention may be implemented as a Low Noise Amplifier (LNA), an RF Variable Gain Amplifier (RFVGA), a Driver Amplifier (DA), or any other suitable type of RF amplifier. Furthermore, although the exemplary embodiments of the present invention are described herein as the low noise amplifier, the present invention is not limited thereto.

Figure 1:
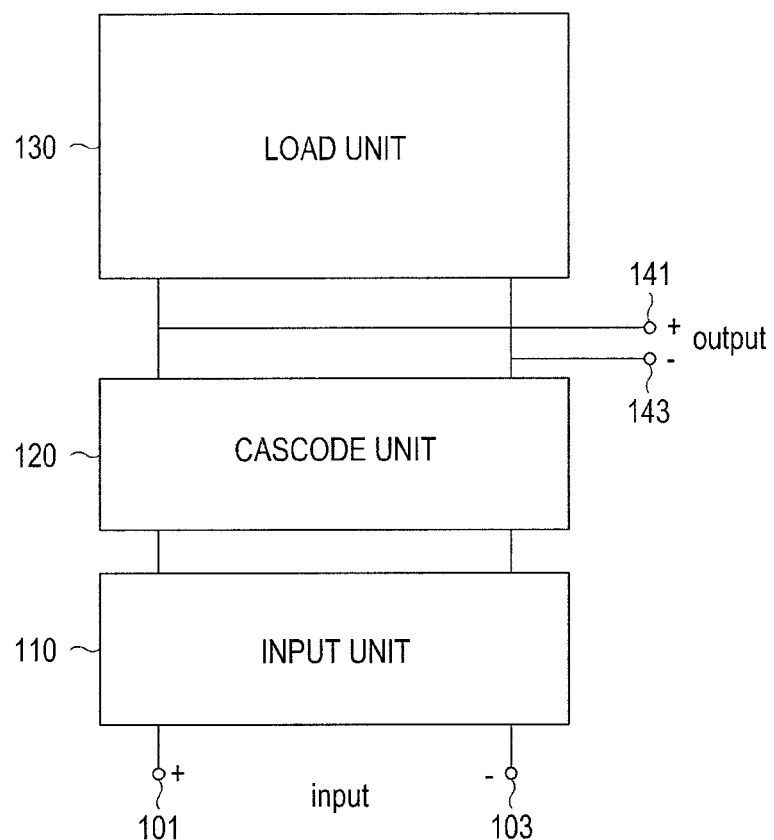
FIG. 1 schematically illustrates an internal structure of a low noise amplifier in a communication system according to the related art.
Figure 2:
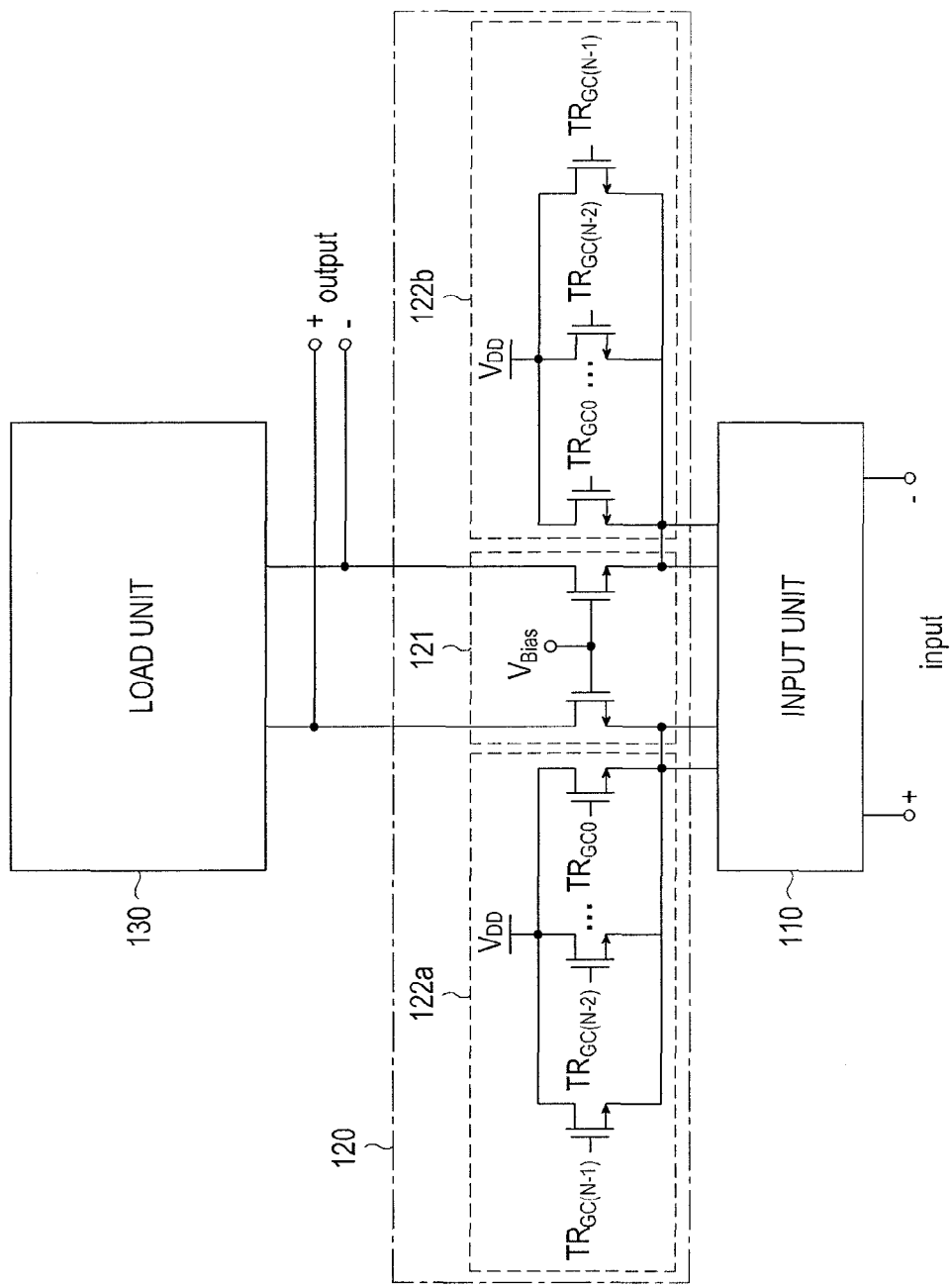
FIG. 2 is a circuit diagram for describing a gain control method using a cascode unit according to the related art.
Figure 3:
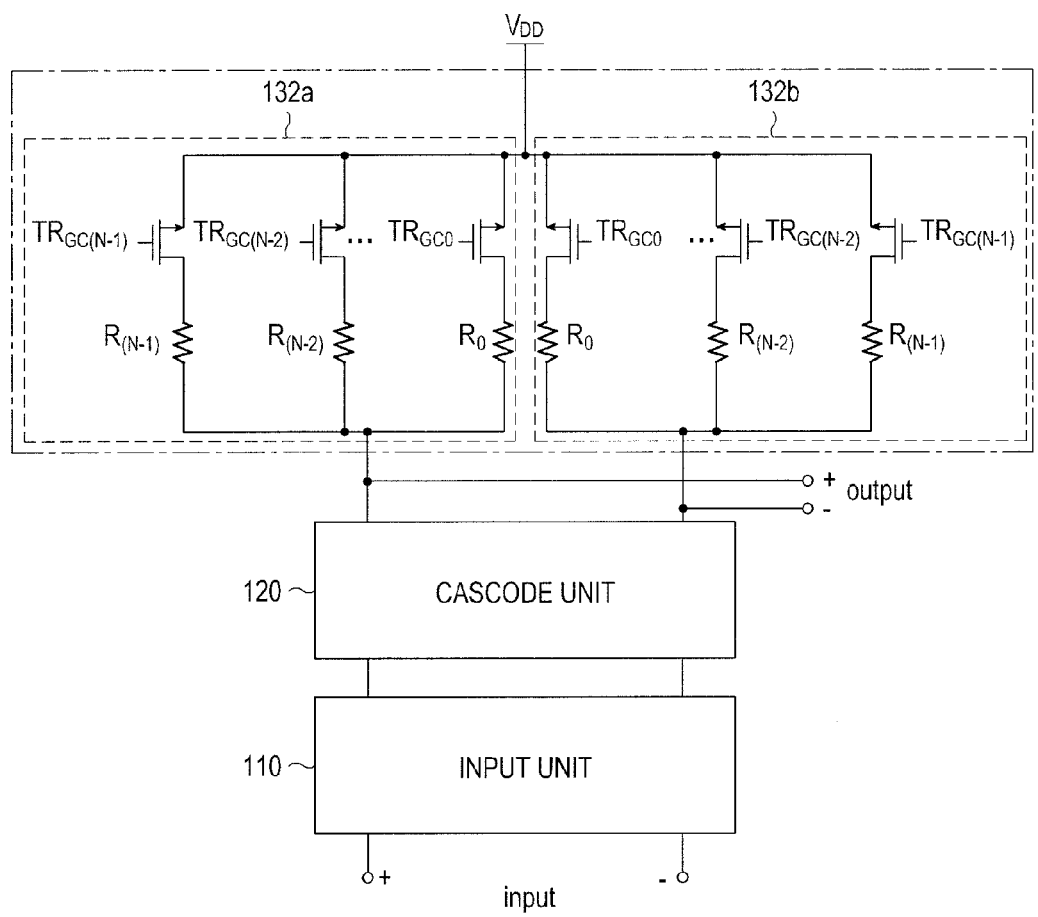
FIG. 3 is a circuit diagram for describing a gain control method through a load unit according to the related art.

As described with reference to FIGS. 2 and 3, according to the related art in which the cascode unit or the load unit controls the gain of the low noise amplifier, performance characteristics of the low noise amplifier may be deteriorated by the parasitic capacitance components generated by a plurality of transistors because the parasitic capacitance components are generated to a considerable extent in the RF band. Meanwhile, in comparison with the RF band, when considering the baseband, the parasitic capacitance components due to the transistors in the baseband are negligible, and the exemplary embodiments of the present invention include a method of controlling the gain of the low noise amplifier by using such characteristics in the baseband. To this end, the exemplary embodiments of the present invention perform amplification without the deterioration of performance characteristics by configuring a circuit for the gain control such that the circuit operates in the baseband, and by having the impedance in the baseband appear as or appear to be the impedance as viewed from the RF band.

Figure 4:
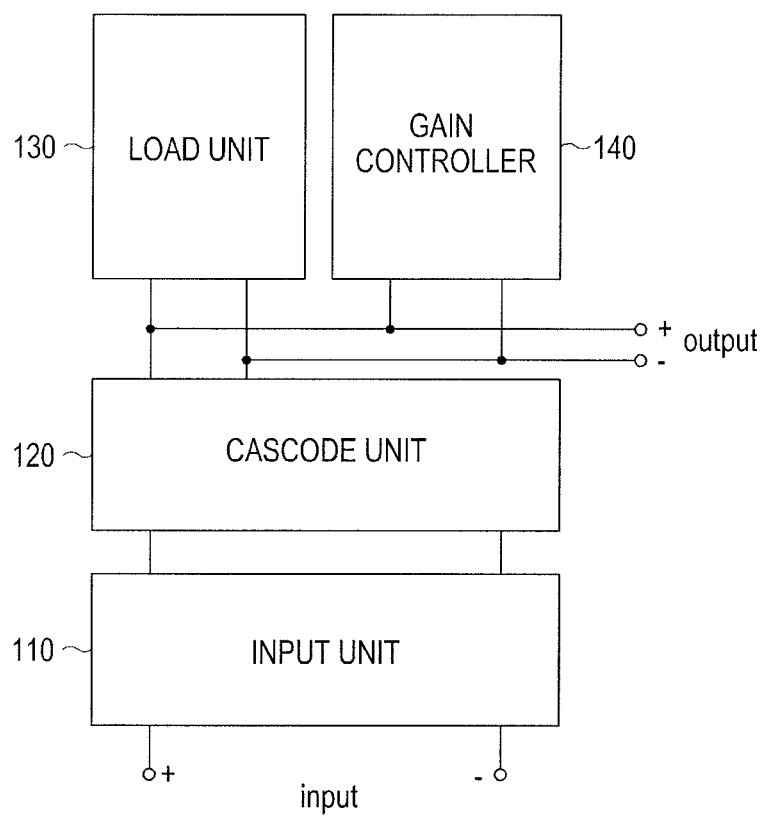
FIG. 4 illustrates a low noise amplifier according to an exemplary embodiment of the present invention.

FIG. 4 illustrates a low noise amplifier according to an exemplary embodiment of the present invention.

Referring to FIG. 4, the low noise amplifier includes an input unit 110, a cascode unit 120, a load unit 130, and a gain controller 140.

The gain controller 140 may control the gain by using impedance conversion characteristics between the baseband and the RF band. That is, the gain controller 140 is configured to operate in the baseband, and controls the gain in the RF band by controlling the impedance in the baseband. In other words, the gain controller 140 controls the gain by using the impedance in the baseband as viewed from the RF band. Furthermore, total gains are determined according to the impedance in the baseband, as viewed from the RF band, and according to the impedance of the load unit, which is connected to the gain controller in parallel.

As described above, since the parasitic capacitance components in the baseband are generated at negligible levels, and thus, deterioration of the performance characteristics due to the parasitic capacitance components is small even though a resistance array for the fine gain control becomes large. According to an exemplary embodiment of the present invention, although a plurality of gain control steps are used for the gain control, a more fine gain control may be performed.

Hereinafter, the gain controller 140 for controlling the gain of the low noise amplifier according to an exemplary embodiment of the present invention will be described in more detail with reference to FIG. 5.

Figure 5:
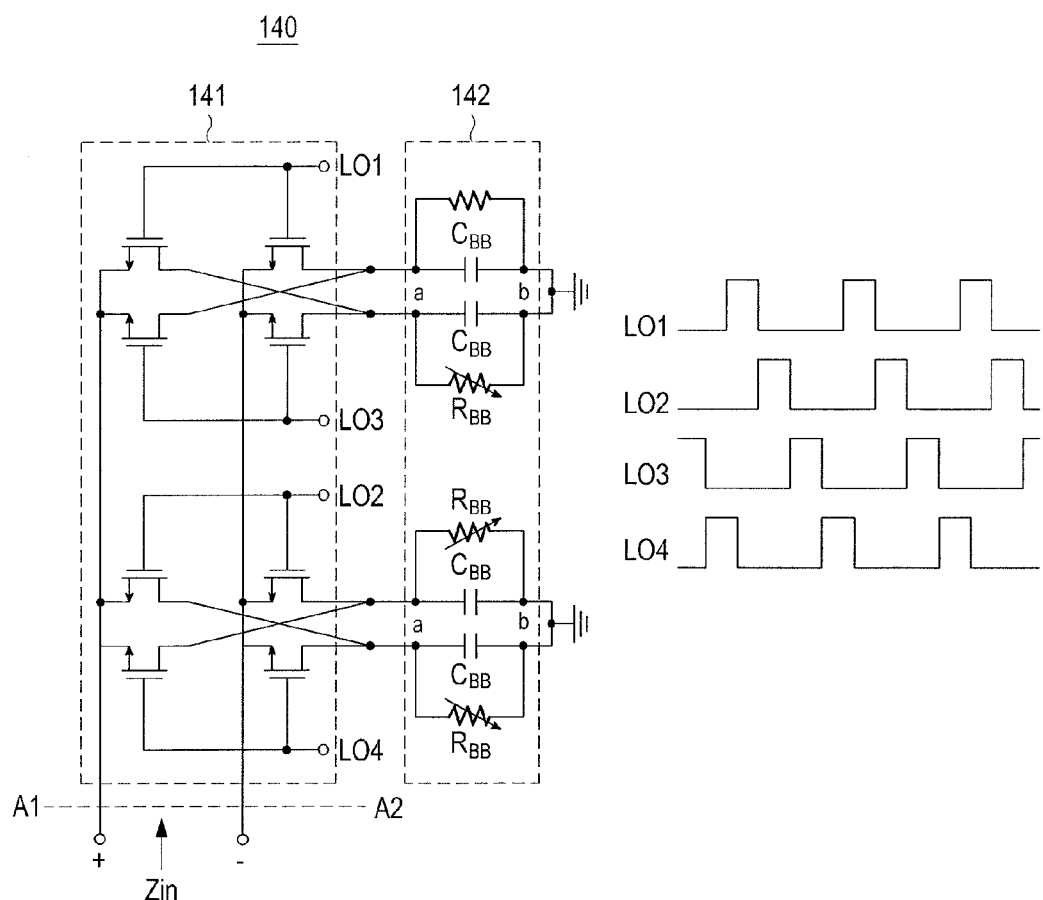
FIG. 5 illustrates a gain controller according to an exemplary embodiment of the present invention.

FIG. 5 illustrates the gain controller according to an exemplary embodiment of the present invention.

Referring to FIG. 5 the gain controller 140 of the low noise amplifier according to an exemplary embodiment of the present invention, as shown in FIG. 4, is illustrated in isolation because the input unit 110, the cascode unit 120, and the load unit 130 may have a structure as described with reference to FIGS. 1 to 4, or may have any suitable structure used in the related art, and their detailed descriptions will be omitted herein.

Referring to FIG. 5, the gain controller 140 includes a passive mixer 141 and a variable resistance unit 142. The passive mixer 141 does not generate a reverse isolation, unlike an active mixer, and thus, in the passive mixer 141, an RF band signal and a baseband signal affect each other. Accordingly, the impedance in the baseband appears to be converted to the impedance in the RF band when viewed from the RF band of the passive mixer 141 when viewed from a boundary line A1-A2. For example, when local oscillation signals LO1 to LO4, which are input to the passive mixer 141, have a duty cycle of 25%, then the impedance in the RF band, that is the impedance $Z_{in}$ viewed from a lower side of the boundary line A1-A2, may be expressed as shown in Equation (1).

$$Z_{in}(s) = R_{SW} + \frac{2}{\pi^2}\{Z_{BB}(S - jw_{LO}) + Z_{BB}(s + jw_{LO})\} \quad (1)$$

At this time, $R_{SW}$ denotes an on-resistance of the passive mixer, $Z_{BB}$ denotes the baseband impedance, and "s" denotes a complex signal including an I signal and a Q signal included in the RF signal. Meanwhile, the baseband impedance ($Z_{BB}$) may be expressed as shown in Equation (2). Hereinafter, the symbol // denotes a parallel connection, $R_{BB}$ denotes a resistance value of the variable resistance unit 142, and $C_{BB}$ denotes a capacitance used for a filtering.

$$Z_{BB} = R_{BB}//C_{BB} \quad (2)$$

Referring to Equation (1), it can be shown that the impedance $Z_{in}$, as viewed from the RF band, is changed according to the baseband impedance $Z_{BB}$. That is, it can be shown that when the baseband impedance $Z_{BB}$ is changed, the impedance $Z_{in}$, as viewed from the RF band, is changed according to the change in the baseband impedance $Z_{BB}$.

Furthermore, as described with reference to FIG. 4, since the gain controller 140 is connected in parallel with the load unit 130, a total impedance $Z_{load}$ of the low noise amplifier may be expressed as shown in Equation (3).

$$Z_{load} = R_{RF}//Z_{in} \quad (3)$$

At this time, $R_{RF}$ denotes a resistance component of the load unit 130, and $Z_{in}$ denotes the impedance as viewed from the RF band. Next, the variable resistance unit 142 according to an exemplary embodiment of the present invention will be described in more detail with reference to FIG. 6.

Figure 6:
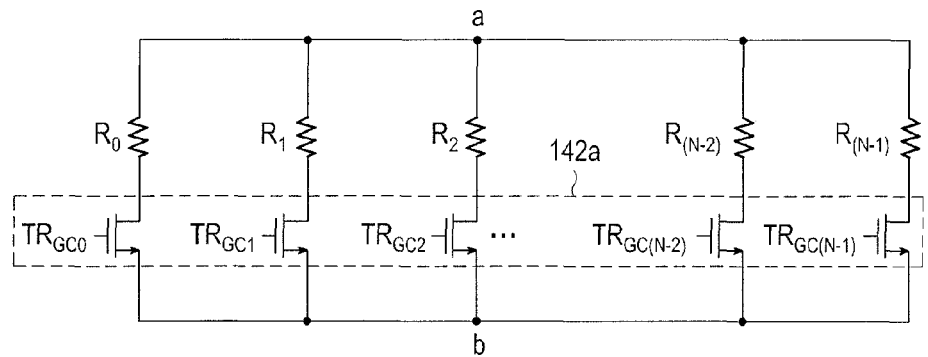
FIG. 6 illustrates a variable resistance unit according to an exemplary embodiment of the present invention.

FIG. 6 illustrates the variable resistance unit according to an exemplary embodiment of the present invention.

Referring to FIG. 6, the variable resistance unit 142 includes N resistors, $R_0$ to $R_{(N-1)}$, that are connected with each other in parallel, and a switching terminal 142a for performing a switching operation to select one or more resistors from among the resistors $R_0$ to $R_{(N-1)}$. The switching terminal 142a includes N transistors, $TR_{GC0}$ to $TR_{GC(N-1)}$, and each of the N transistors is respectively connected in series to one of the N resistors. The switching operation of the switching terminal 142a is performed by a control signal applied from an external circuit (not shown).

The impedance $Z_{BB}$ of the variable resistance unit 142 is determined by resistance values of one or more resistors selected according to the switching operation of the switching terminal 142a and Equation (2). Accordingly, the determined impedance of the variable resistance unit 142 and the impedance in the baseband, that is, impedance $Z_{in}$ as viewed from the RF band, may be calculated. The calculated impedance $Z_{in}$ is used for calculating the total impedance $Z_{load}$ of the amplifier using Equation (3), and will be described below. Hereinafter, an entire structure of a low noise amplifier according to an exemplary embodiment of the present invention will be described in more detail with reference to FIG. 7.

Figure 7:
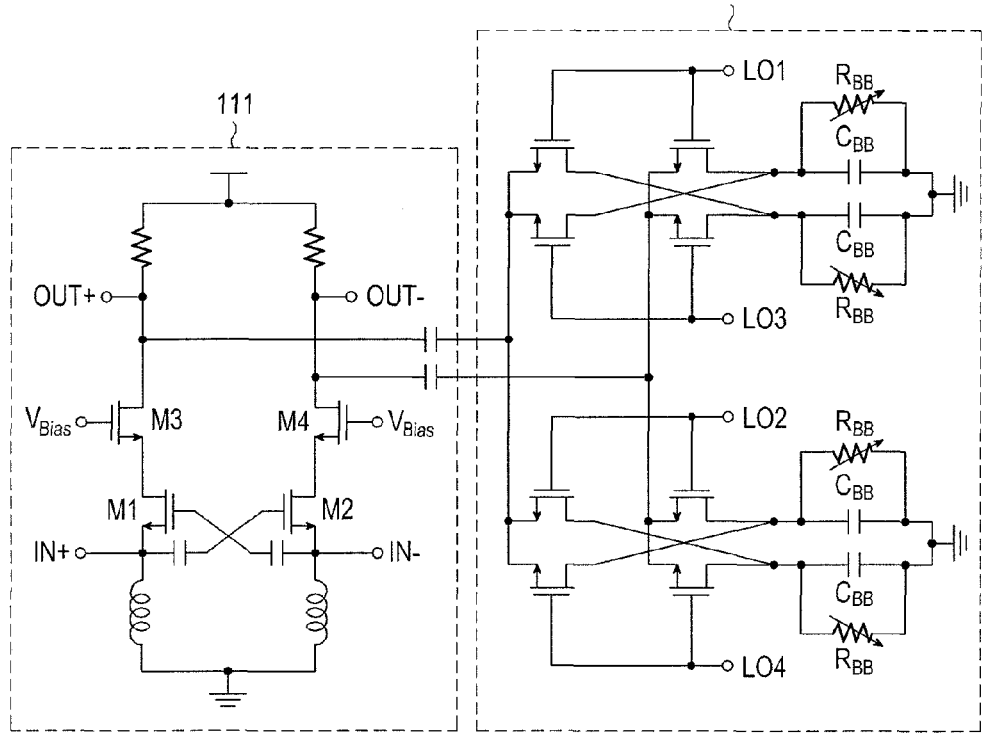
FIG. 7 is a circuit diagram illustrating a low noise amplifier according to an exemplary embodiment of the present invention.

FIG. 7 is a circuit diagram for describing a low noise amplifier according to an exemplary embodiment of the present invention.

Referring to FIG. 7, the low noise amplifier according to an exemplary embodiment of the present invention includes an amplifier 111 and the gain controller 140. The gain controller 140 has been described with reference to FIGS. 5 and 6, its detailed description will be omitted herein. The amplifier 111 includes, although not shown in FIG. 7, the input unit 110, the cascode unit 120, and the load unit 130, which are shown in FIG. 4, and may be configured by a general circuit as described with reference to FIGS. 1 to 4.

For the amplifier 111, IN+ and IN− are input terminals to which signals of an I channel and a Q channel are respectively input as differential input signals, wherein the I channel and the Q channel are included in the RF signal received through an antenna (not shown). M1 and M2 are transistors operated by a common source, and M3 and M4 are transistors operated by a common gate. Meanwhile, OUT+ and OUT− are output terminals for outputting amplified RF signals, and $R_{RF}$ is a load impedance of the low noise amplifier.

As described above, the impedance conversion in the gain controller 140 results in the baseband impedance ZBB being converted into the impedance Zin, as viewed from the RF band. Accordingly, the impedance $Z_{in}$, as viewed from the RF band, may be expressed by using the baseband impedance $Z_{BB}$ as shown in Equation (1). Additionally, the total impedance $Z_{load}$ of the low noise amplifier is calculated as shown in Equation (3) by using the impedance $Z_{in}$ and the resistance value of the resistor $R_{RF}$ of the load unit 130. The calculated total impedance $Z_{load}$ is used for calculating a total gain $LNA_{gain}$ of the amplifier according to Equation (4).

$$LNA_{gain} = G_m \times (R_{RF}//Z_{in}) \quad (4)$$

At this time, $G_m$ refers to a transconductance of the RF signal input terminal, which is the transistors M1 and M2. As described above, according to an exemplary embodiment of the present invention, the total impedance is calculated by using the impedance in the RF band, as converted from the baseband impedance, and the resistance value of the load unit. Thus, the total gain of the amplifier is obtained by using the calculated total impedance.

Figure 8:
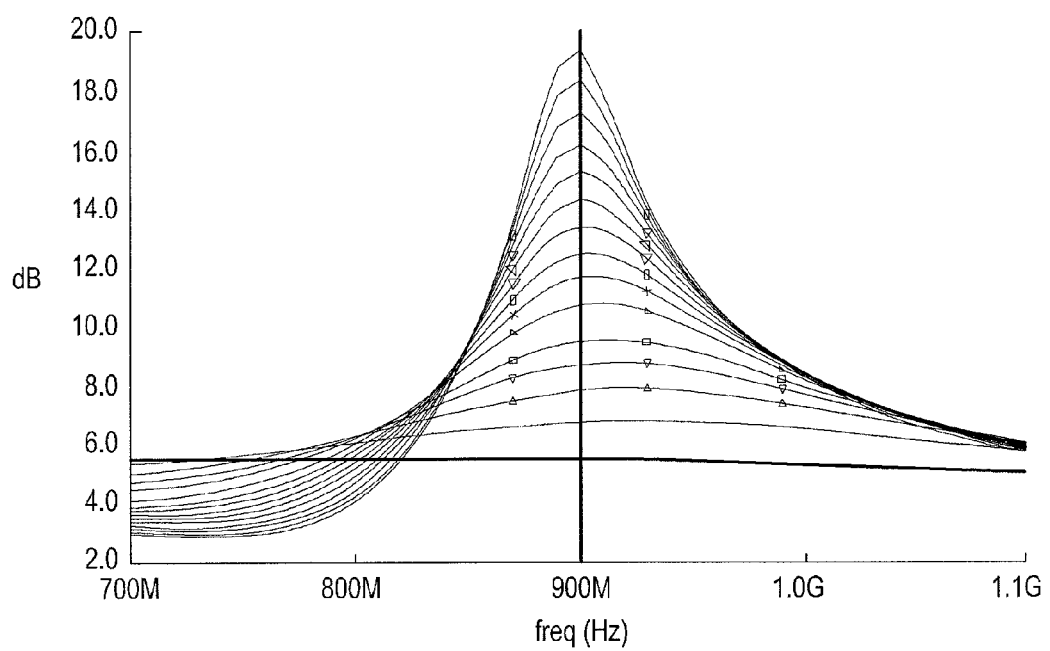
FIG. 8 is a diagram of a simulation result showing a fine gain control effect according to an exemplary embodiment of the present invention.

FIG. 8 is a diagram of a simulation result showing a fine gain control effect according to an exemplary embodiment of the present invention.

Referring to FIG. 8, the fine gain control is performed in a desired RF band of 900 MHz. However, the present invention is not limited thereto, and the fine gain control may be performed in any suitable RF band. Since the parasitic capacitor components are negligibly generated in the baseband, a more fine or granular impedance control is possible, and accordingly, a fine or granular total gain control of the amplifier is possible. A result of the fine gain control according to an exemplary embodiment of the present invention is illustrated in FIG. 8.

While the invention has been shown and described with reference to certain exemplary embodiments thereof, it will be understood by those skilled in the art that various changes in form and details may be made therein without departing from the spirit and scope of the invention as defined by the appended claims and their equivalents. Accordingly, the various modifications should not be construed separately from the technical idea or aspect of the present invention.

What is claimed is:

1. A Radio Frequency (RF) amplifier in a communication system, the RF amplifier comprising:
   an input unit configured to receive an RF signal;
   a cascode unit configured to amplify the RF signal according to a gain and for outputting the amplified RF signal;
   a load unit connected to the cascode unit; and
   a gain controller configured to convert an impedance in a baseband to an impedance viewed from an RF band, the gain controller being connected in parallel to the load unit, the gain controller being separate from the cascode unit, the gain controller comprising:
      a passive mixer configured to frequency mix a local oscillation signal and the RF signal received from the input unit; and
      one or more variable resistance units having a resistance value determined by a switching operation of the passive mixer.

2. The RF amplifier as claimed in claim 1, wherein the gain controller converts the impedance in the baseband in order to control the gain.

3. The RF amplifier as claimed in claim 2, wherein the gain is determined according to the impedance in the baseband, as viewed from the RF band, and the resistance value of the load unit.

4. The RF amplifier as claimed in claim 3, wherein the gain is determined according to an equation of $LNA_{gain}=G_m \times (R_{RF}//Z_{in})$, wherein $LNA_{gain}$ denotes the gain, $G_m$ denotes a transconductance of an RF signal input terminal, $R_{RF}$ denotes the resistance value of the load unit, and $Z_{in}$ denotes the impedance in the baseband.

5. The RF amplifier as claimed in claim 1, wherein the one or more variable resistance units include N resistors connected in parallel so that a gain control of N steps is possible, wherein each one of the N resistors respectively corresponds to one of the N steps.

6. The RF amplifier as claimed in claim 5, wherein the one or more variable resistance units comprise a switching terminal for performing the switching operation of selecting at least one resistor from among the N resistors.

7. A method of controlling a Radio Frequency (RF) amplifier in a communication system, the method comprising:
   receiving an RF signal; and
   amplifying the RF signal according to a gain,
   wherein the gain is controlled by converting an impedance in a baseband to an impedance viewed from an RF band,
   wherein the gain is controlled, by converting the impedance in a baseband to an impedance viewed from the RF band, and in parallel with a determination of a resistance value, the gain being controlled separately from the amplification of the RF signal, and
   wherein the converting of the impedance in the baseband to the impedance viewed from the RF band comprises:
      frequency mixing a local oscillation signal and the received RF signal; and
      determining the resistance value by a switching operation of a passive mixer performing the frequency mixing.

8. The method as claimed in claim 7, wherein the gain is controlled by controlling the impedance in the baseband.

9. The method as claimed in claim 8, wherein the gain is determined according to the impedance in the baseband, as viewed from the RF band, and the resistance value.

10. The method as claimed in claim 9, wherein the gain is determined according to an equation of $LNA_{gain}=G_m \times (R_{RF}//Z_{in})$, wherein $LNA_{gain}$ denotes the gain, $G_m$ denotes a transconductance of an RF signal input terminal, $R_{RF}$ denotes a resistance value of a load unit, and $Z_{in}$ denotes the impedance in the baseband.

11. A gain controller of a Radio Frequency (RF) amplifier including an input unit configured to receive an RF signal, a cascode unit configured to amplify the RF signal according to a gain of the RF amplifier and output the amplified RF signal, and a load unit connected to the cascode unit in a communication system, the gain controller comprising:
   a passive mixer configured to frequency mix a local oscillation signal and the RF signal received from the input unit; and
   one or more variable resistance units having a resistance value determined by a switching operation of the passive mixer.

12. The gain controller as claimed in claim 11 wherein the gain controller controls the gain of the RF amplifier by converting an impedance in a baseband to an impedance viewed from an RF band, and
   wherein the gain controller is connected in parallel to the load unit.

13. The gain controller as claimed in claim 11, wherein the gain controller controls the impedance in the baseband in order to control the gain of the RF amplifier.

14. The gain controller as claimed in claim 13, wherein the gain of the RF amplifier is determined according to the impedance in the baseband, as viewed from the RF band, and the resistance value of the load unit.

15. The gain controller as claimed in claim 14, wherein the gain of the RF amplifier is determined according to an equation of $LNA_{gain}=G_m \times (R_{RF}//Z_{in})$, wherein $LNA_{gain}$ denotes the gain of the RF amplifier, $G_m$ denotes a transconductance of an RF signal input terminal, $R_{RF}$ denotes the resistance value of the load unit, and $Z_{in}$ denotes the impedance in the baseband.

16. The gain controller as claimed in claim 11, wherein the one or more variable resistance units include N resistors connected in parallel so that a gain control of N steps is possible,
   wherein each one of the N resistors respectively corresponds to one of the N steps.

17. The gain controller as claimed in claim 16, wherein the one or more variable resistance units comprise a switching terminal for performing the switching operation of selecting at least one resistor from the resistors.

18. The RF amplifier as claimed in claim 1, wherein the gain controller and the load unit are connected in parallel to the cascode unit.

* * * * *